US006236786B1

United States Patent
Aoki et al.

(10) Patent No.: US 6,236,786 B1
(45) Date of Patent: May 22, 2001

(54) SUBSTRATE WITH OPTICAL WAVEGUIDE AND METHOD OF MAKING THE SAME

(75) Inventors: Hikoharu Aoki, Nagoya; Takaaki Ushiki, Numata; Hirochika Nakajima, c/o Brother Kogyo Kabushiki Kaisha 15-1 Naeshiro-cho, Mizuho-ku, Nagoya-shi, Aichi-ken, 467-8561, all of (JP)

(73) Assignees: Brother Kogyo Kabushiki Kaisha, Nagoya; Hirochika Nakajima, Hirasuka, both of (JP)

( * ) Notice: Subject to any disclaimer, the term of this patent is extended or adjusted under 35 U.S.C. 154(b) by 0 days.

(21) Appl. No.: 09/263,631

(22) Filed: Mar. 5, 1999

(30) Foreign Application Priority Data

Mar. 6, 1998 (JP) .................................................. 10-054955

(51) Int. Cl.[7] ...................................................... G02B 6/26
(52) U.S. Cl. .................................. 385/50; 385/14; 385/49
(58) Field of Search ................................... 385/14, 15, 31, 385/39, 47, 48, 49, 50

(56) References Cited

U.S. PATENT DOCUMENTS

| 3,663,194 | * | 5/1972 | Greenstein et al. ................ 385/14 X |
| 4,070,516 | * | 1/1978 | Kaiser .................................. 385/14 X |
| 4,472,020 | * | 9/1984 | Evanchuk ................................ 385/14 |
| 5,125,054 | * | 6/1992 | Ackley et al. ........................... 385/49 |
| 5,200,631 | * | 4/1993 | Austin et al. ........................ 385/14 X |
| 5,898,803 | * | 4/1999 | Mueller-Fieldler et al. ......... 385/14 X |

* cited by examiner

Primary Examiner—John D. Lee
(74) Attorney, Agent, or Firm—Oliff & Berridge, PLC

(57) ABSTRACT

A substrate with an optical waveguide includes a substrate having a through hole and two sides, a first optical waveguide defined in the though hole of the substrate so as to linearly extend between both sides of the substrate, a second optical waveguide defined on at least one of the sides of the substrate, and direction changing means for changing a transmitting direction of a light signal from either one of the first and second optical waveguides to the other. Each optical waveguide includes a core layer for transmitting the light signals and a clad layer formed around the core layer.

18 Claims, 5 Drawing Sheets

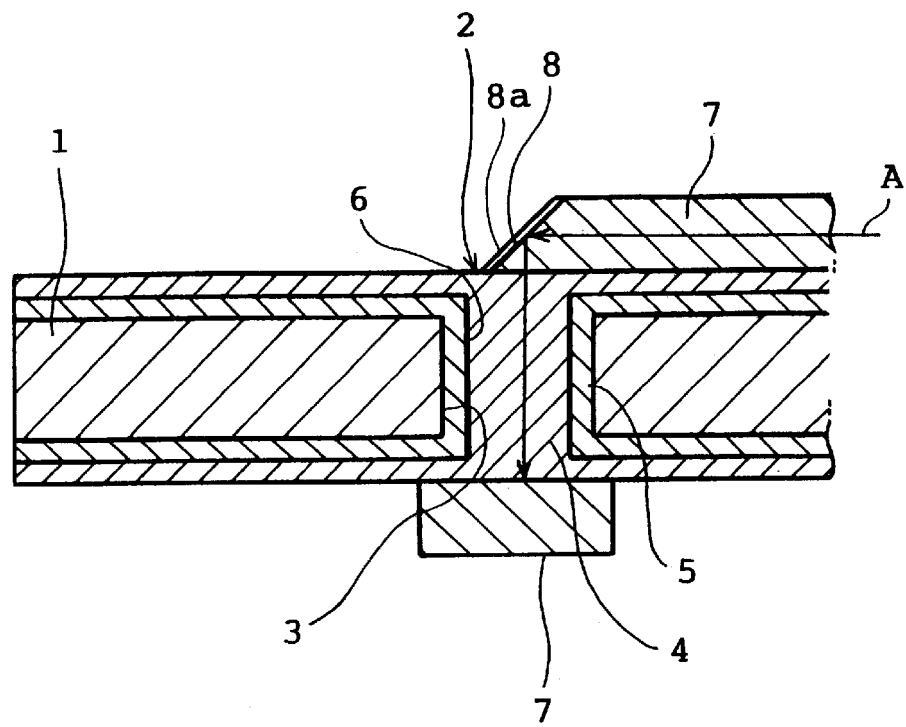
F I G. 1
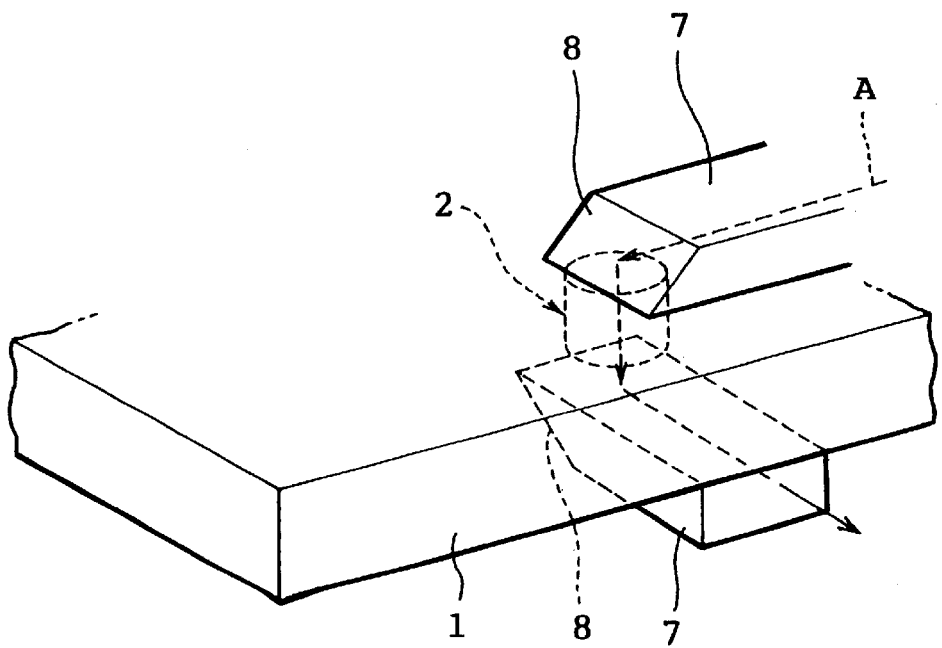
F I G. 2

SUBSTRATE WITH OPTICAL WAVEGUIDE AND METHOD OF MAKING THE SAME

BACKGROUND OF THE INVENTION

1. Field of the Invention

This invention relates to a substrate provided with an optical waveguide through which a light signal is transmitted and a method of making such a substrate.

2. Description of the Related Art

A substrate with an optical waveguide has recently been proposed which is provided with an optical waveguide so that light signals and electric signals are simultaneously treated. For example, the prior art has proposed a construction in which an optical waveguide is provided on one of two sides of a substrate and a reflecting face serving as direction changing means and a light-sensitive element are disposed at one end side of the optical waveguide. In this construction, a light signal introduced into the optical waveguide is reflected on the reflecting face so that the direction of the light signal is changed to the light-sensitive element side. The light signal is then sensed by the light-sensitive element.

In the above-described construction, however, it is only at one side of the substrate that the light signal is transmitted. In other words, the transmitting direction of the light signal can be changed only two-dimensionally or on a plane. As a result, a region used for the light signal transmission is limited in a single substrate.

SUMMARY OF THE INVENTION

Therefore, an object of the present invention is to provide a substrate with an optical waveguide in which the substrate can be effectively used for the light signal transmission and which can cope with high-densification of the substrate.

Another object of the invention is to provide a method of making a substrate with an optical waveguide in which the optical waveguide can be desirably made in the substrate.

The present invention provides a substrate with an optical waveguide comprising a substrate having a through hole and two sides, a first optical waveguide defined in the through hole of the substrate so as to linearly extend between both sides of the substrate, a second optical waveguide defined on at least one of the sides of the substrate, and direction changing means for changing a transmitting direction of a light signal from either one of the first and second optical waveguides to the other, each optical waveguide including a core layer for transmitting the light signals and a clad layer formed around the core layer.

According to the above-described substrate, the first optical waveguide can optically connect between both sides of the substrate. Consequently, since the optical waveguides through which the light signal is transmitted are provided on both sides of the substrate respectively, the substrate can be used effectively. Further, the first optical waveguide is defined in the through hole of the substrate. Consequently, the light signal can be transmitted from one side to the other side at any location of the substrate and accordingly, a transmission pattern of the light signal can be designed more freely.

In this construction, the transmitting efficiency of the light signal can further be improved. Further, two second optical waveguides are preferably defined at both sides of the substrate respectively. Additionally, the substrate is preferably made of polyimide.

In another preferred form, the substrate further comprises signal converting means provided on said other side of the substrate for converting the light signal received via the first optical waveguide to a corresponding electric signal, and an electric circuit section into which the electric signal is supplied. According to this construction, the light signal transmitted via, for example, an external optical fiber network is received at said one side of the substrate and further transmitted via the first optical waveguide to said other side of the substrate, where the light signal is converted to the electric signal by the signal converting means. When the electric signal is thereafter supplied to an electric or electronic circuit, the light signal can be used so that information is transmitted at high speeds or over a wide band between electric circuit sections of respective substrates connected together via the network.

The invention also provides a method of making a substrate with an optical waveguide, the substrate having a through hole and two sides and comprising a first optical waveguide defined in the through hole of the substrate so as to linearly extend between both sides of the substrate, a second optical waveguide defined on at least one of the sides of the substrate, and direction changing means for changing a transmitting direction of a light signal from either one of the first and second optical waveguides to the other. The method comprises the steps of immersing the substrate in a resin liquid for making the first optical waveguide so that the through hole is filled with the resin liquid, and hardening the resin liquid after the immersing step, thereby making the first optical waveguide.

According to the above-described method, the first optical waveguide can be made desirably and readily.

The invention further provides a method of making a substrate with an optical waveguide, the substrate having a through hole and two sides and comprising a first optical waveguide including a core layer linearly formed between both sides of the substrate for propagating a light signal and a clad layer covering the core layer, a second optical waveguide defined on at least one of the sides of the substrate, and direction changing means for changing a transmitting direction of a light signal from either one of the first and second optical waveguides to the other. The method comprises the steps of disposing a metal die having one open end at the substrate side along a route of the second optical waveguide so that the other end of the die covers an opening of the through hole, and filling the die with a resin liquid for forming the optical waveguides, and hardening the resin liquid subsequently to the filling step, thereby forming the first and second optical waveguides.

According to the above-described method, the first and second optical waveguides are simultaneously formed by using the metal die. Consequently, steps of manufacturing the substrate can be simplified. Further, since the first and second optical waveguides are integrally formed, no boundary between them is formed. Consequently, a reflection loss resulting from transmission of the light signal between both waveguides can be reduced to a large extent.

BRIEF DESCRIPTION OF THE DRAWINGS

Other objects, features and advantages of the present invention will become clear upon reviewing the following description of the preferred embodiments, made with reference to the accompanying drawings, in which:

FIG. 1 is a partial longitudinal section of a substrate with an optical waveguide of a first embodiment in accordance with the present invention;

FIG. 2 is a partial broken perspective view of the substrate;

DETAILED DESCRIPTION OF THE PREFERRED EMBODIMENTS

Figure 3A:
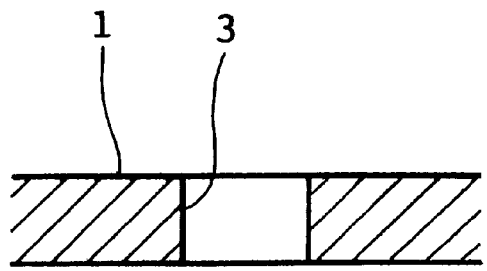
FIGS. 3A to 3D illustrate steps of forming a first optical waveguide in the substrate.
Figure 3B:
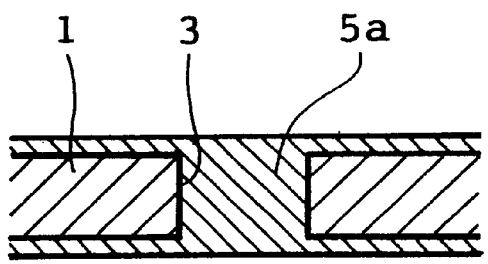
Figure 3C:
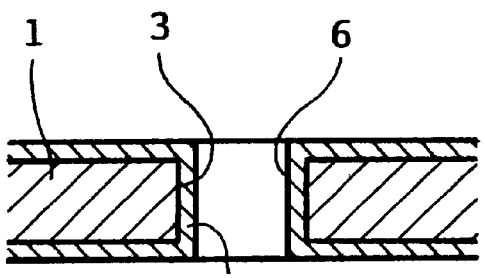
Figure 3D:
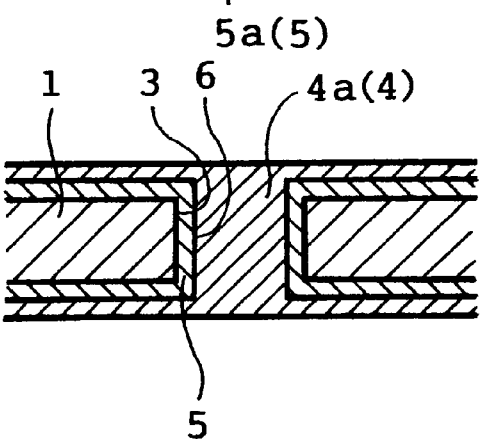

A first embodiment of the present invention will be described with reference to FIGS. 1 to 4. A substrate 1 is made from a polyimide film having a high heat resistance. The polyimide film has a thickness of 125 $\mu$m and a refractive index of 1.751. The film has elasticity. The substrate 1 is provided with a first optical waveguide 2 extending between upper and lower sides thereof in the direction of the thickness thereof, as viewed in FIG. 1. The first optical waveguide 2 is defined in a through hole 3 formed through the substrate 1. The first optical waveguide 2 includes a core layer 4 for transmitting a light signal and a clad layer 5 formed around the core layer 4. The core layer 4 is made of, for example, a fluorine-contained polyimide resin having a refractive index of 1.560. The clad layer 5 is made from, for example, a fluorine-contained polyimide resin having a refractive index of 1.541.

A method of forming the first optical waveguide 2 in the substrate 1 will now be described with reference to FIGS. 3A to 3D.

1. A circular through hole 3 is formed in a portion of the substrate 1 made from the polyimide film, in which portion the first optical waveguide 2 is to be formed. See FIG. 3A. This through hole 3 is formed by a KrF excimer laser with a wavelength of 248 nm. The through hole 3 has an inner diameter of, for example, 150 $\mu$m.

2. The substrate 1 is then immersed in a first resin from which the clad layer 5 is made or a fluorine-contained polyimide resin liquid (dipping) so that the through hole 3 is filled with the first resin. In this case, the first resin also adheres to both sides of the substrate 1. Then, after the substrate 1 is taken out of the resin liquid, the first resin 5a is hardened. See FIG. 33. The through hole 3 is buried with the first resin 5a as the result of hardening.

3. A circular core through hole 6 (see FIG. 3C) is formed by a laser or plasma in the through hole 3 buried with the first resin 5a with the clad layer S remaining. The core through hole 6 has an inner diameter of, for example, 125 $\mu$m. The core through hole 6 may be formed by inserting a generally bar-shaped hollow member.

4. The substrate 1 formed with the core through hole 6 is immersed in a second resin from which the core layer 4 is made or more specifically fluorine-contained polyimide resin, so that the core through hole 6 is filled with the second resin. In this case, the second resin also adheres to both sides of the substrate 1. Then, after the substrate 1 is taken out of the resin liquid, the second resin 4a is hardened. See FIG. 3D. The core through hole 6 is buried with the first resin 5a as the result of hardening. As a result, the core layer 4 is made of the second resin 4a in the through hole 3 of the substrate 1, and the clad layer 5 is made of the first resin 5a.

Two second optical waveguides 7 each having the same construction are provided on an upper side and an underside of the substrate 2 formed with the fist optical waveguide 2 respectively as shown in FIGS. 1 and 2. Each second optical waveguide 7 is made from a fluorine-contained polyimide resin having a refractive index of 1.57, for example. The second optical waveguides 7 have reflecting faces 8 formed to face both ends of the first optical waveguide 2 respectively. Each reflecting face 8 constitutes direction changing means for changing a direction of the light signal. The reflecting faces 8 are inclined at an angle of 45 degrees relative to the upper side and the underside of the substrate 1 respectively. A metal thin film 8a is preferably formed on each reflecting face 8, so that a reflectance of each reflecting face can be improved. The thin film 8a is eliminated in FIG. 2.

The second optical waveguides 7 are previously formed independently of the substrate 1. More specifically, the second optical waveguides 7 are fixedly bonded on the upper side and the underside of the substrate 1 by the second resin 4a provided for forming the core layer 4 and serving as an bonding agent. The second optical waveguides 7 are disposed so that their lengths in which the light signal passes through them are substantially perpendicular to each other.

When the light signal is supplied to the upper second optical waveguide 7 in the direction of arrow A in FIGS. 1 and 2, for example, the light signal passes through the second optical waveguide 7, impinging on the reflecting face 8a. As a result, the direction of the light signal is changed to the first optical waveguide 2 side. The light signal then passes through the core layer 4 of the first optical waveguide 2 downward. The light signal then impinges on the reflecting face 8a of the lower second optical waveguide 7 such that its direction is changed. The light signal then passes through the lower second optical waveguide 7 to thereby be delivered. The input light signal supplied to the upper second optical waveguide 7 has a direction differing by 90 degrees from a direction of the output light signal delivered from the lower second optical waveguide 7. On the other hand, when supplied to the lower optical waveguide 7, the light signal is delivered from the upper second optical waveguide 7 through a reverse path with respect to the above-described one.

Figure 4:
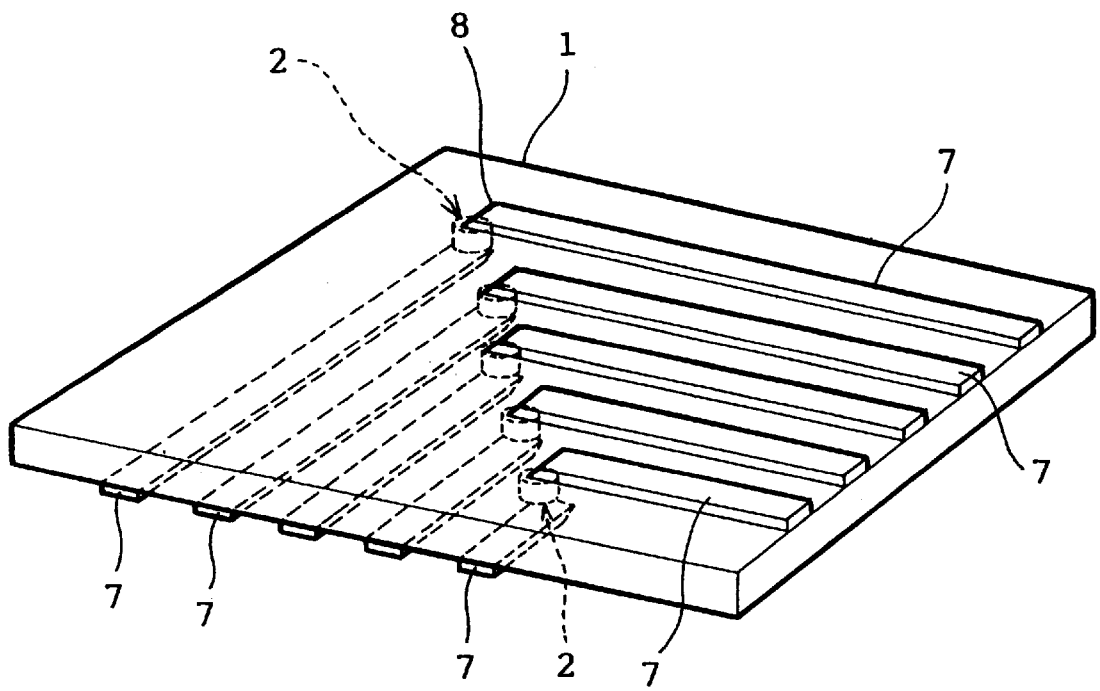
FIG. 4 is a perspective view of the substrate with first and second optical waveguides.

Referring now to FIG. 4, a plurality of sets of the first and second optical waveguides 2 and 7 are provided on a single substrate 1. In this construction, too, the upper and lower second optical waveguides 7 in each set are disposed so that their directions of length in which the light signal passes through them are substantially perpendicular to each other. Further, a photosensitive element may be provided on the underside of the substrate 1, instead of the lower second optical waveguide 7 although this is not shown in the drawings. in this construction, the light signal supplied to the upper second optical waveguide 7 can be detected via the first optical waveguide 2 by the photosensitive element.

According to the above-described embodiment, the first optical waveguide 2 is disposed in the substrate 1 so as to extend in the direction of thickness of the substrate, so that the upper side and the underside of the substrate 1 can optically be connected to each other. Consequently, since means for treating the light signal can be provided on both sides of the substrate 1, the substrate can effectively be used and the high-densification of the substrate can be coped with.

Further, the first optical waveguide 2 is provided in the through hole 3 formed in any location of the substrate 1. The substrate 1 can be compacted even though the first optical waveguide 2 is provided in the substrate 1. Additionally, a transmission pattern of the light signal can be designed more freely. Further, the first optical waveguide 2 is formed into a linear shape. When both second optical waveguides 7 are coupled together, they are mounted so that the reflecting faces 8 agree with the location of the core layer 4 formed in the core through hole 6. Consequently, the coupling can readily be carried out.

Further, the first optical waveguide 2 includes the core layer 4 for transmitting the light signal and the clad layer 5 formed around the core layer 4. This improves the transmission efficiency of the first optical waveguide 2, whereupon the light signal can desirably be transmitted. Additionally, the second optical waveguides 7 are provided on the upper side and the underside of the substrate 2 respectively. The directions of the upper and lower second optical waveguides 7 are suitably set so that the direction of the light signal can freely be set in the substrate 1.

Further, when the first optical waveguide 2 is formed in the substrate 1, the manufacturing process including the above-described steps 1 to 4 is employed. Consequently, the first optical waveguide 2 can be formed in the substrate 1 desirably and readily.

Figure 5:
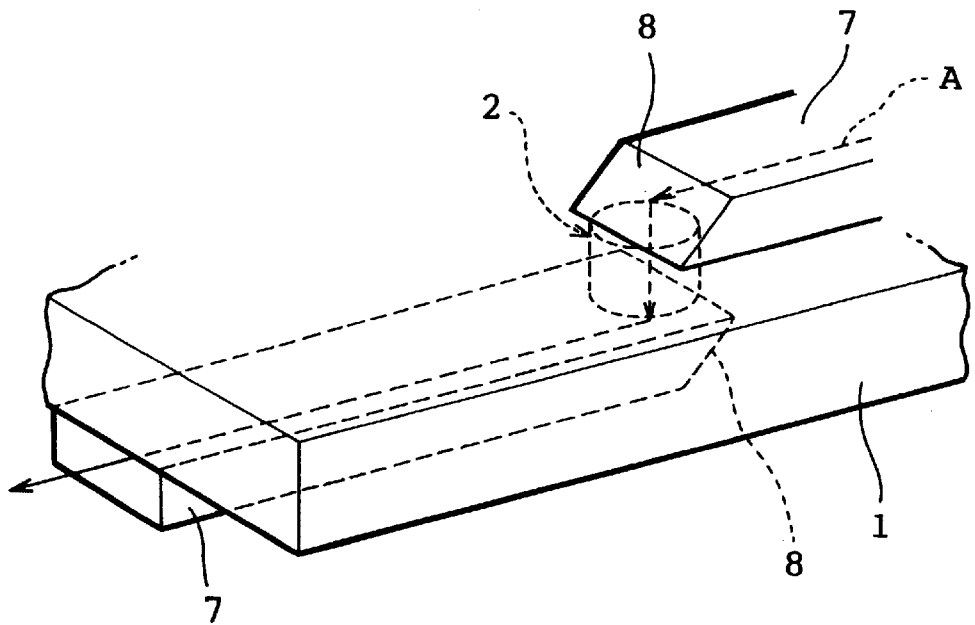
FIG. 5 is a view similar to FIG. 2, showing a substrate of a second embodiment in accordance with the present invention.

FIG. 5 illustrates a second embodiment of the invention. The second embodiment differs from the previous embodiment in the following point. The lower second optical waveguide 7 longitudinally extends in the same direction as the upper second optical waveguide 7 extends.

Figure 6:
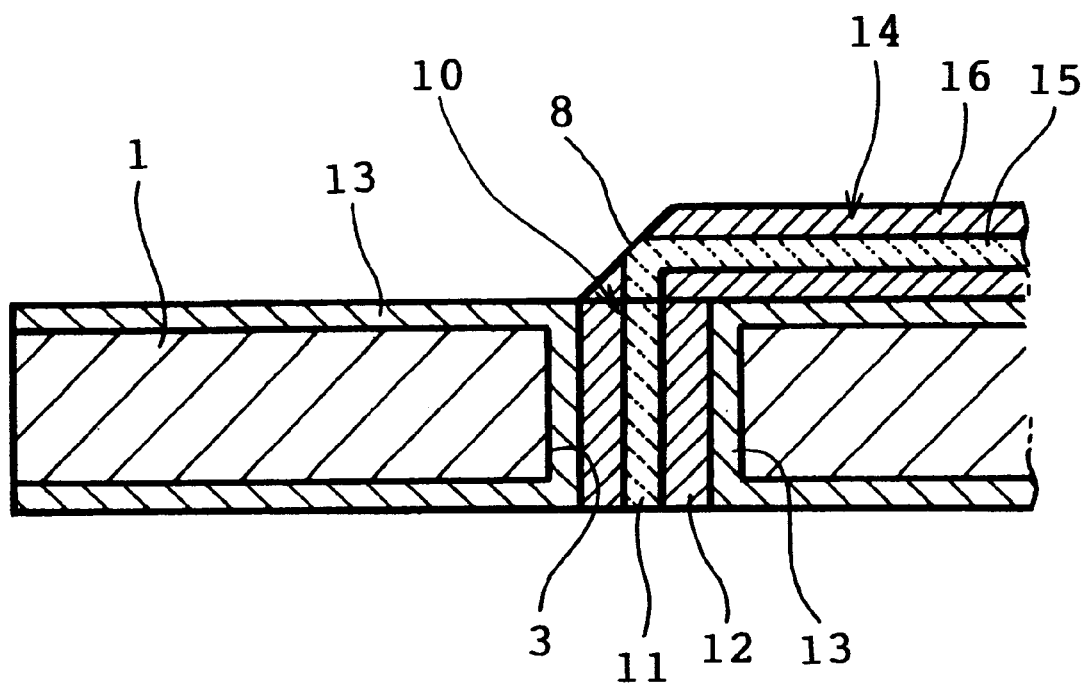
FIG. 6 is a view similar to FIG. 1, showing a substrate of a third embodiment in accordance with the present invention.

FIG. 6 illustrates a third embodiment of the invention. The third embodiment differs from the first embodiment in the following point. The first optical waveguide 10 is provided at the center of the through hole 3 formed in the substrate 1 and includes a central core layer 11 and a clad layer 12 provided around the core layer 11. Second clad layers 13 are provided on the upper side and the underside of the substrate 1 and around the clad layer 12 in the through hole 3.

A second optical waveguide 14 provided on the upper side of the substrate 1 includes a central core layer 15 and a clad layer 16 disposed around the core layer 15. The second optical waveguide 14 has an end on which the reflecting face 8 is formed. The direction of the core layer 15 of the second optical waveguide 14 is changed at the reflecting face 8 so that the core layer 15 and the core layer 11 of the first optical waveguide 10 are connected together. On the underside of the substrate 1 are provided an optical waveguide similar to that on the upper side of the substrate 1, a photosensitive element and a photodiode 17 as shown in FIG. 7.

According to the third embodiment, the upper side and the underside of the substrate 1 can optically be connected to each other, whereupon the light signal can be transmitted between the upper side and the underside of the substrate 1. Consequently, the substrate 1 can effectively be used for transmission of the light signal. This construction can cope with high-densification of components mounted on the substrate 1.

Figure 7:
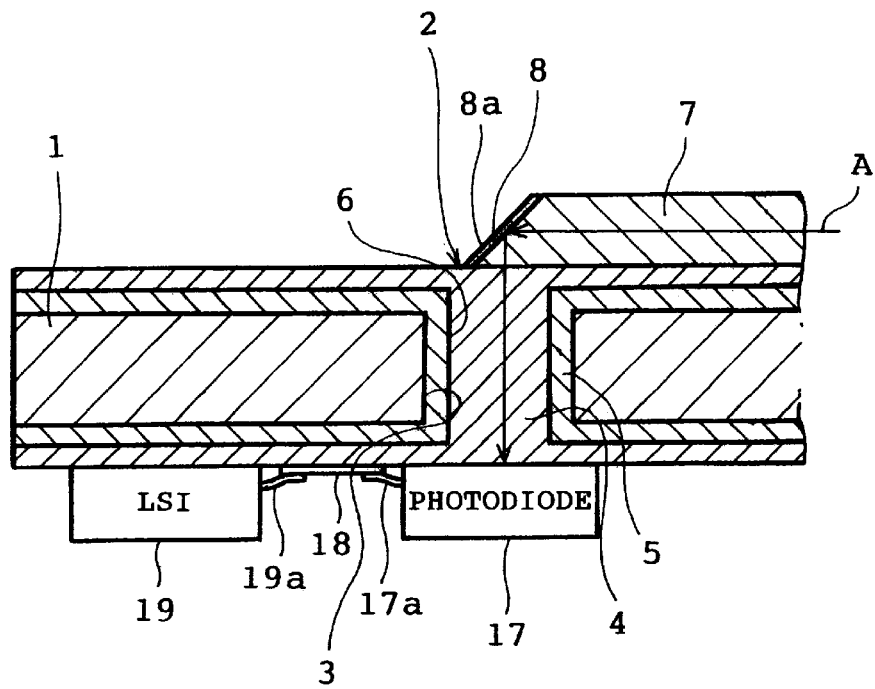
FIG. 7 is a view similar to FIG. 1, showing a substrate of a fourth embodiment in accordance with the present invention.

FIG. 7 illustrates a fourth embodiment of the invention. The fourth embodiment differs from the first embodiment in the following point. A photodiode 17 serving as the signal converting means is provided beneath the core through hole 6 on the underside of the substrate 1, instead of the second optical waveguide 7. The photodiode 17 includes a lead wire 17a serving as a terminal from which the photodiode delivers an electric signal. The lead wire 17a is electrically connected by soldering to one end of a wiring pattern 18 made of copper foil on the underside of the substrate 1.

An LSI (electric circuit section) 19 comprising a microcomputer is disposed on the left of the photodiode 17 as viewed in FIG. 7. The LSI 19 includes a lead wire 19a serving as an input terminal and electrically connected to the other end of the wiring pattern 18. The electric circuit section includes an electric circuit provided with an electronic circuit throughout the description.

The operation of the substrate of the fourth embodiment will now be described. Assume now an external optical communication network comprising an optical fiber, although this is not shown in the drawings The upper second optical waveguide 7 is connected to the optical communication network or coupled to the optical fiber of the network. The substrate 1 is installed in a dwelling or an office to serve as a terminal of the network. A light signal transmitted from a distant signal transmission point or node is supplied via the optical communication network to the second optical waveguide 7.

The light signal supplied to the second optical waveguide 7 is supplied via the first optical waveguide 2 to the photodiode 17, so that the light signal is converted to an electric signal. The electric signal is then supplied to the LSI 19. Accordingly, when the LSI 19 constitutes a part of a personal computer used at a home, high-speed and wideband data transmission by means of a light signal can be realized among a large number of personal computers.

Figure 8:
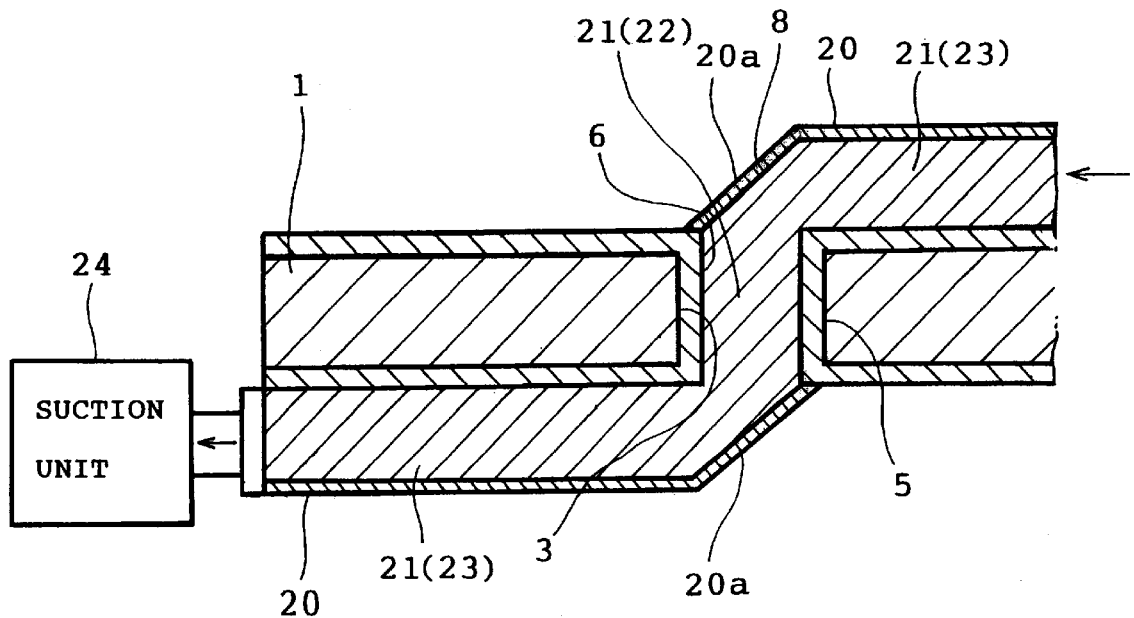
FIG. 8 is a view similar to FIG. 1, showing a substrate of a fifth embodiment in accordance with the present invention.

FIG. 8 illustrates a fifth embodiment of the invention. The fifth embodiment differs from the first embodiment in the following. In the fifth embodiment, two metal dies are attached to opposite sides of the substrate 1 which has passed through the steps of FIGS. 3A to 3C in the first embodiment, respectively. A resin liquid 21 is injected into a space defined by the substrate and the metal dies 20 so that first and second optical waveguides 22 and 23 are formed en bloc.

Each die 20 has a shape conforming to that of the second optical waveguide 23. More specifically, each die 20 is formed substantially into the shape of a rectangular box and is open at the substrate 1 side, a resin-liquid injecting side and a resin-liquid sucking side. The dies 20 have inclined faces 20a at portions opposed to the injecting and sucking openings respectively. Each inclined face is at an angle of 45 degrees relative to the substrate 1. The dies 20 are disposed so that portions thereof having the inclined faces 20a cover upper and lower openings of the core through hole 6 respectively.

A suction unit 24 such as a vacuum pump is connected to the open end of the die 20 disposed at the underside of the substrate 1. An injector for injecting the resin liquid 21 is mounted on the open end of the die 20 disposed at the upper side of the substrate 1. The resin liquid 21 of fluorine-contained polyimide is injected from the injector into a space defined by the dies 20 and the substrate 1. The injected resin liquid 21 is sucked into the space by the suction unit 24. When the space is completely filled with the resin liquid 21, the substrate 1 and the dies 20 are retained in their states so that the resin liquid 21 is hardened. After the resin liquid 21 has been hardened, the dies 20 are removed and the first and second optical waveguides 22 and 23 are formed en bloc.

According to the above-described fifth embodiment, the metal dies 20 are disposed at both sides of the substrate 1 respectively, and the resin liquid 21 is injected into the space defined by the dies 20 and the substrate 1 so that the first optical waveguide 22 and the second optical waveguides 23 are formed en bloc. Consequently, the manufacturing process can be simplified. Furthermore, no boundary face or interface (discontinuous face) is structurally provided between the first optical waveguide 22 and each second optical waveguide 23. The fifth embodiment differs from the first embodiment in this point. Consequently, a reflection loss resulting from transmission of light signal between the optical waveguides 22 and 23 can be reduced to a large extent. Further, since the inclined faces 20a are formed at end sides of the metal dies 20 respectively, the optical waveguides 22 and 23 and the direction changing means are simultaneously formed, the manufacturing process can further be simplified.

Additionally, the resin liquid 21 is injected from the side of the metal die 20 disposed at the upper side of substrate 1 and sucked by the suction device 24 disposed at the underside of the substrate 1, so that the space defined by the substrate 1 and the dies 20 is completely filled with the resin liquid 21 without void. Further, the resin liquid can also be injected when the substrate 1 is maintained in a horizontal state.

The first optical waveguide 2 or 10 may be formed by only the core layer 4 or 11. A previously formed discrete first optical waveguide 2 or 10 may be inserted into the through hole 3 of the substrate 1 depending on the thickness of the substrate. A groove may be formed in one side of the substrate so that the second optical waveguide 7 or 14 is provided therein. The thin film 8a may or may not be provided.

The electric circuit section should not be limited to the LSI 19. It may comprise a simpler circuit arrangement. For example, the electric circuit section may receive an externally transmitted signal so that an output result according to the received signal is obtained at the substrate 1 side. More specifically, an LED may be turned on or off.

In the fifth embodiment, the metal dies 20 may not be disposed at both sides of the substrate 1 when the first and second optical waveguides 22 and 23 are formed with the dies 20. For example, when the photodiode 17 is disposed on the underside of the substrate 1 as in the fourth embodiment, only one metal die 20 may be disposed at the upper side of the substrate 1 and the underside opening may be closed by a suitable closing member. Further, only one second optical waveguide 23 may be formed on the upper side of the substrate 1.

Further in the fifth embodiment, the dies 20 may be disposed on the substrate 1 in the state shown in FIG. 3A without forming the clad layer 5 so that an optical waveguide having only a core layer is formed. Each die 20 may not be provided with the inclined face 20a. For example, the end corresponding to the inclined face may be formed into the shape of a square pole, and the square end may be cut with cutting means such as a knife when the resin liquid is hardened and the dies 20 are removed, so that the 45-degree inclined face may be formed.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

We claim:

1. A substrate with an optical waveguide comprising:
   a substrate having a through hole and two sides;
   a first optical waveguide defined in the through hole of the substrate so as to linearly extend between both sides of the substrate;
   a second optical waveguide defined on at least one of the sides of the substrate; and
   direction changing means for changing a transmitting direction of a light signal from either one of the first and second optical waveguides to the other, each optical waveguide including a core layer for transmitting the light signals and a clad layer formed around the core layer.

2. A substrate according to claim 1, wherein two second optical waveguides are defined at both sides of the substrate respectively.

3. A substrate according to claim 1, wherein the substrate is made of polyimide.

4. A substrate according to claim 1, wherein the second optical waveguide has one end located at the though hole side and the direction changing means is formed as an inclined face formed on the end of the second optical waveguide at an angle of 45 degrees relative to the substrate.

5. A substrate according to claim 4, wherein the direction changing means includes a metal thin film formed on the inclined face.

6. A substrate according to claim 1, further comprising signal converting means provided on said other side of the substrate for converting the light signal received via the first optical waveguide to a corresponding electric signal, and an electric circuit section into which the electric signal is supplied.

7. A method of making a substrate with an optical waveguide, the substrate having a through hole and two sides and comprising a first optical waveguide including a core layer linearly formed between both sides of the substrate for propagating a light signal and a clad layer covering the core layer, a second optical waveguide defined on at least one of the sides of the substrate, and direction changing means for changing a transmitting direction of a light signal from either one of the first and second optical waveguides to the other, the method comprising the Steps of:

immersing the substrate formed with the through hole in a first resin liquid for making the clad layer so that the through hole is filled with the resin liquid and thereafter hardening the resin liquid;

forming a core through hole in the through hole filled with the resin liquid with the clad layer remaining;

disposing a metal die having one open end at the substrate side along a route of the second optical waveguide so that the other end of the die covers an opening of the through hole, and filling the die with a resin liquid for forming the optical waveguides; and hardening the resin liquid subsequently to the filling step, thereby forming the first and second optical waveguides.

8. A method of making a substrate with an optical waveguide, the substrate having a through hole and two sides and comprising a first optical waveguide defined in the through hole of the substrate so as to linearly extend between both sides of the substrate, a second optical waveguide defined on at least one of the sides of the substrate, and direction changing means for changing a transmitting direction of a light signal from either one of the first and second optical waveguides to the other, the method comprising the steps of:

immersing the substrate in a resin liquid for making the first optical waveguide so that the through hole is filled with the resin liquid; and hardening the resin liquid after the immersing step, thereby making the first optical waveguide.

9. A method according to claim 8, wherein two second optical waveguides are defined at both sides of the substrate respectively.

10. A method according to claim 8, wherein the substrate is made of polyimide.

11. A method according to claim 8, wherein the second optical waveguide has one end located at the though hole side and the direction changing means is formed as an inclined face formed on the end of the second optical waveguide at an angle of 45 degrees relative to the substrate.

12. A method according to claim 11, wherein the direction changing means includes a metal thin film formed on the inclined face.

13. A method according to claim 8, further comprising signal converting means provided on said other side of the substrate for converting the light signal received via the first optical waveguide to a corresponding electric signal, and an electric circuit section into which the electric signal is supplied.

14. A method of making a substrate with an optical waveguide, the substrate having a through hole and two sides and comprising a first optical waveguide including a core layer linearly formed between both sides of the substrate for propagating a light signal and a clad layer covering the core layer, a second optical waveguide defined on at least one of the sides of the substrate, and direction changing means for changing a transmitting direction of a light signal from either one of the first and second optical waveguides to the other, the method comprising the steps of:

immersing the substrate formed with the through hole in a first resin liquid for making the clad layer so that the through hole is filled with the resin liquid and thereafter hardening the resin liquid;

forming a core through hole in the through hole filled with the resin liquid with the clad layer remaining; and immersing the substrate formed with the core through hole in a second resin liquid for making a core layer so that the through hole is filled with the second resin liquid and hardening the second resin liquid after the second resin liquid immersing step, thereby making the first optical waveguide.

15. A method of making a substrate with an optical waveguide, the substrate having a through hole and two sides and comprising a first optical waveguide including a core layer linearly formed between both sides of the substrate for propagating a light signal and a clad layer covering the core layer, a second optical waveguide defined on at least one of the sides of the substrate, and direction changing means for changing a transmitting direction of a light signal from either one of the first and second optical waveguides to the other, the method comprising the steps of:

disposing a metal die having one open end at the substrate side along a route of the second optical waveguide so that the other end of the die covers an opening of the through hole, and filling the die with a resin liquid for forming the optical waveguides; and hardening the resin liquid subsequently to the filling step, thereby forming the first and second optical waveguides.

16. A method according to claim 15, wherein the die has at said one end side thereof an inclined face formed at an angle of 45 degrees relative to the substrate.

17. A method according to claim 15, wherein the die is disposed at both sides of the substrate so as to sandwich the through hole.

18. A method according to claim 17, wherein the resin liquid is poured into the die from a portion of the die disposed at one side of the substrate and sucked from a portion of the die disposed at the other side of the substrate.

* * * * *